United States Patent
Wyland

(10) Patent No.: US 8,203,219 B2
(45) Date of Patent: Jun. 19, 2012

(54) ELECTRICALLY ENHANCED WIREBOND PACKAGE

(75) Inventor: Chris Wyland, Livermore, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 852 days.

(21) Appl. No.: 12/294,211

(22) PCT Filed: Mar. 23, 2007

(86) PCT No.: PCT/IB2007/050997
§ 371 (c)(1),
(2), (4) Date: Sep. 23, 2008

(87) PCT Pub. No.: WO2007/107964
PCT Pub. Date: Sep. 27, 2007

(65) Prior Publication Data
US 2009/0102067 A1  Apr. 23, 2009

Related U.S. Application Data

(60) Provisional application No. 60/785,908, filed on Mar. 23, 2006.

(51) Int. Cl.
*H01L 23/48* (2006.01)
*H01L 23/495* (2006.01)

(52) U.S. Cl. ........ 257/784; 257/783; 257/787; 257/780; 257/666; 257/E23.024

(58) Field of Classification Search .............. 257/784, 257/787, E23.024, 780, 666
See application file for complete search history.

(56) References Cited

U.S. PATENT DOCUMENTS

| | | | |
|---|---|---|---|
| 4,488,674 A | 12/1984 | Egawa et al. | |
| 5,170,930 A | 12/1992 | Dolbear et al. | |
| 5,622,898 A | 4/1997 | Zechman | |
| 5,986,885 A * | 11/1999 | Wyland | 361/704 |

(Continued)

FOREIGN PATENT DOCUMENTS

EP  0418749 A2  3/1991
(Continued)

OTHER PUBLICATIONS

Japanese Patent Office, Office Action dated Aug. 30, 2011, Application No. 2009-501011, 2 pages.

*Primary Examiner* — Nitin Parekh
(74) *Attorney, Agent, or Firm* — Haynes and Boone, LLP

(57) ABSTRACT

Consistent with an example embodiment, there is an integrated circuit (IC) device in a packaging having electrically insulated connections. The IC device comprises a semiconductor device (100) mounted onto a die attachment area (10); the semiconductor device has a plurality of bonding pads (20a, 25a, 30a, 35a). A lead frame having a plurality of bonding fingers (20b, 25b, 30b, 35b) surrounds the die attachment area. A plurality of mutually isolated connection conductors (25d, 30d, 40, 50) having respective first ends are attached to respective bonding pads on the semiconductor device and the plurality of mutually isolated connection conductors having respective second respective second ends are attached to respective bonding fingers of the lead frame. An insulating material (45) coats at least a portion of the plurality of mutually isolated connection conductors. The mutually isolated connection conductors may include a bond wire (40, 50) for the signal connection and a conductive strap (25d, 30d) for the voltage reference connection. The insulating material (45) coating the bond wires reduces the likelihood of short circuits during encapsulation.

20 Claims, 4 Drawing Sheets

U.S. PATENT DOCUMENTS

| | | | |
|---|---|---|---|
| 6,023,103 A * | 2/2000 | Chang et al. | 257/781 |
| 6,046,075 A | 4/2000 | Manteghi | |
| 6,534,711 B1 * | 3/2003 | Pollack | 174/529 |
| 6,727,579 B1 * | 4/2004 | Eldridge et al. | 257/692 |
| 2002/0117330 A1 * | 8/2002 | Eldridge et al. | 174/260 |
| 2003/0089983 A1 | 5/2003 | Huang et al. | |
| 2004/0014309 A1 | 1/2004 | Nakanishi | |
| 2004/0119172 A1 | 6/2004 | Downey et al. | |
| 2004/0124546 A1 * | 7/2004 | Saran et al. | 257/787 |
| 2006/0226534 A1 | 10/2006 | Liang et al. | |

FOREIGN PATENT DOCUMENTS

| | | |
|---|---|---|
| EP | 0786806 A | 7/1997 |
| JP | 57113234 A | 7/1982 |
| JP | 62183544 A | 8/1987 |
| JP | 63250832 | 10/1988 |
| JP | 04065840 A | 3/1992 |
| JP | 2002170842 | 8/1994 |
| JP | 06216183 | 6/2002 |
| JP | 2005099301 A | 4/2005 |

* cited by examiner

ELECTRICALLY ENHANCED WIREBOND PACKAGE

The invention relates to integrated circuit (IC) packaging. More particularly this invention relates to wire bonding an IC device die wherein selected connection conductors between a semiconductor die and package substrate are covered with an insulating material.

The electronics industry continues to rely upon advances in semiconductor technology to realize higher-function devices in more compact areas. For many applications realizing higher-functioning devices requires integrating a large number of electronic devices into a single silicon wafer. As the number of electronic devices per given area of the silicon wafer increases, the manufacturing process becomes more difficult.

Many varieties of semiconductor devices have been manufactured with various applications in numerous disciplines. Such silicon-based semiconductor devices often include metal-oxide-semiconductor field-effect transistors (MOSFET), such as p-channel MOS (PMOS), n-channel MOS (NMOS) and complementary MOS (CMOS) transistors, bipolar transistors, BiCMOS transistors. Such MOSFET devices include an insulating material between a conductive gate and silicon-like substrate; therefore, these devices are generally referred to as IGFETs (insulated-gate FET).

Each of these semiconductor devices generally includes a semiconductor substrate on which a number of active devices are formed. The particular structure of a given active device can vary between device types. For example, in MOS transistors, an active device generally includes source and drain regions and a gate electrode that modulates current between the source/drain regions.

Furthermore, such devices may be digital or analog devices produced in a number of wafer fabrication processes, for example, CMOS, BiCMOS, Bipolar, etc. The substrates may be silicon, gallium arsenide (GaAs) or other substrate suitable for building microelectronic circuits thereon.

After undergoing the process of fabrication, the silicon wafer has a predetermined number of devices. These devices are tested. Good devices are collected and packaged.

The packaging of complex IC devices is increasingly playing a role in their ultimate performance. Many packages include a substrate upon which a device die is mounted on a predetermined die attach area surrounded by pad landings. The device die itself has bonding pads to facilitate its connection to the outside world via bond wires attached to respective bonding pads from their respective pad landings surrounding the die attach area. The pad landings connect to external contacts through electrical traces defined in the substrate. In some package types, the assembled device is protected from environmental damage through encapsulation in a suitable molding compound.

As devices grow in complexity the number of wire bonds approaches hundreds. Design is trending to reduce the spacing among the wire bonds in an effort to keep package sizes scaled to the continuing miniaturization and feature enhancement of electronic products. Such products include laptop computers, portable digital assistants PDAs), wireless telephones, automotive electronic control modules, etc.

As the technology crams more performance into a smaller package, there is a risk of adjacent bond wires bending and touching one another during the encapsulation process, the touching wires resulting in electrical shorts. In an effort to prevent the short-circuiting of bond wires U.S. Pat. No. 6,046, 075 titled, "Oxide Wire Bond Insulation in Semiconductor Assemblies," which is herein incorporated by reference in its entirety.

In an example, a semiconductor integrated circuit package is provided with insulated bonding wires. The bonding wires have an oxygen-plasma oxide formed thereupon to thereby provide electrically insulated bonding wires that help to prevent short-circuits between adjacent bonding wires.

However, the oxide formed on the bond wires is somewhat brittle. Thus, during the encapsulation, the flexing of the bond wires from the flow of molding compound may cause the insulating oxide to flake off and risk the touching and short-circuiting of adjacent bond wires with one another.

There exists a need to address the challenge of insulating bond wires so that the insulation applied is sufficiently durable to withstand the rigors of encapsulation and to provide, as a substitute for bond wires, alternative connection conductors.

The present invention has been found useful in providing insulation on bond wires whose movement during package encapsulation may result in short circuits between bond wires in the vicinity of one another. In lieu of bond wires at some device die/package locations, conductive straps surrounded by an insulating material may be used. At other locations, one or more bond wires may be coated with a resilient insulating material. In particular, conductive straps may be suitable for voltage reference connections of a device while signal pins are bond wires coated with insulating material.

In an example embodiment, there is an integrated circuit (IC) device in a package having electrically insulated connections. The IC device comprises a semiconductor device mounted onto a die attachment area; the semiconductor device has a plurality of bonding pads. A lead frame having a plurality of bonding fingers surrounds the die attachment area. A plurality of mutually isolated connection conductors having respective first ends are attached to respective bonding pads on the semiconductor device and the plurality of mutually isolated connection conductors having respective second respective second ends are attached to respective bonding fingers of the lead frame. At least a portion of the plurality of mutually isolated connection conductors are coated with an insulating material.

In another example embodiment, there is an integrated circuit (IC) device in a BGA package substrate, the BGA package substrate having electrically insulated connections. The IC comprises a semiconductor device mounted onto an attachment area, the semiconductor device having bonding pads. Bonding fingers surround the die attachment area. There is a plurality of mutually isolated connection conductors having respective first ends attached to respective bonding pads on the semiconductor device and having respective second ends attached to respective bonding fingers. A portion of the plurality of mutually isolated connection conductors is coated with an insulating material.

In yet another example embodiment, there is an integrated circuit (IC) device in a package substrate, the package substrate having electrically insulated connections. The IC device comprises a semiconductor device mounted onto an attachment area, the semiconductor device having bonding pads. Bonding fingers surround the die attachment area. There are signal connection conductors having respective first ends attached to respective bonding pads on the semiconductor device and having respective second ends attached to respective bonding fingers. A number of the signal connection conductors are bond wires coated with a resilient insulating coating. There are voltage reference conductors having respective first ends attached to respective bonding pads on the semiconductor device and having respective second ends attached to respective bonding finger. A number of the voltage reference conductors are conductive straps surrounded by dams of insulating material. A passivation envelope encapsulates the semiconductor device, signal connection conductors, voltage reference conductors, and bonding fingers on the substrate.

In another example embodiment, there is a method for providing enhanced conductors in a package substrate containing a semiconductor device chip. The method comprises selecting a suitable package substrate and bond finger combination. On selected bond fingers, voltage reference locations are defined. Signal pins having insulation are determined. On a mask, patterns printing strap trenches are defined. With the mask, strap trenches on the package substrate are defined. In the strap trenches, conductive material is deposited therein, filling the strap trenches. Previously determined signal pins are bonded with either insulated or non-insulated wires. Insulated signal wires at their respective ends are sealed at the respective bond pads and bond fingers. In a passivating envelope, the semiconductor device chip is encapsulated.

The above summary of the present invention is not intended to represent each disclosed embodiment, or every aspect, of the present invention. Other aspects and example embodiments are provided in the figures and the detailed description that follows.

The invention may be more completely understood in consideration of the following detailed description of various embodiments of the invention in connection with the accompanying drawings, in which.

Figure 1A:
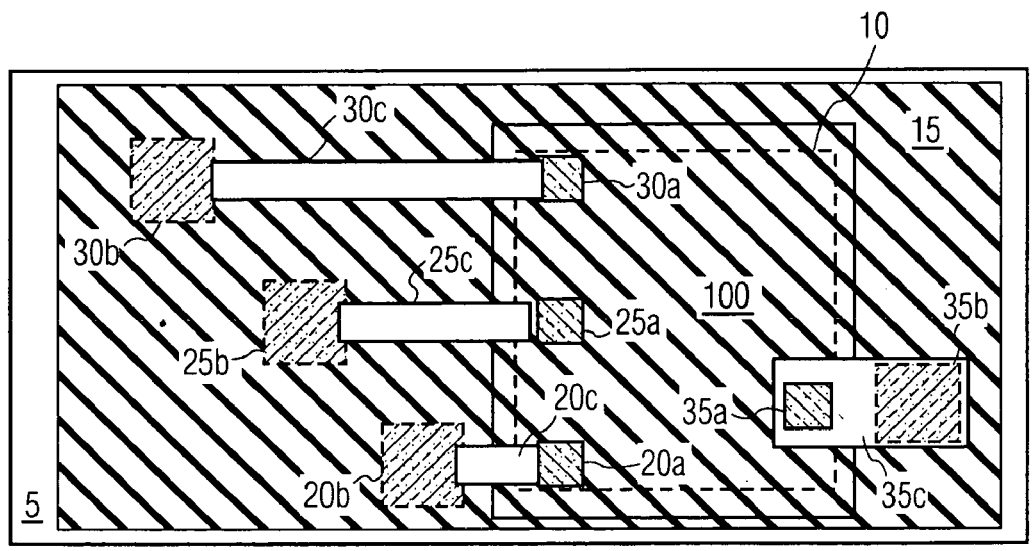
FIG. 1A is a top view of a package substrate depicting insulating trenches defining the voltage reference straps that will formed between the respective bond pads and bonding fingers in a package substrate according to an embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

The present invention has been found to be useful reducing the likelihood of short circuits of electrical conductors in a wire bond package. Short circuits are avoided by insulating bond wires with a resilient insulating material. In addition, electrical performance of the wire bond package is improved by using conductive straps to connect power and ground between their respective bond pads and lead fingers of the package lead frame. The conductive straps reduce the impedance of insulated bond wires. In a further enhancement, insulating material may be interposed between the conductive straps, as well. During encapsulation with a molding compound, the interposed insulating material minimizes any movement of the bond wires and conductive straps. Any movement that does resulting in touching of conductors does not short circuit them in that they are protected by insulating material.

In an example embodiment, a ball grid array (BGA) package has been modified to make use of the present invention. Conductive straps connect the power and ground pads of the IC device to their respective bond fingers on the package substrate. A bond wire in the vicinity of the conductive straps is insulated with a resilient material. Another bond wire not near the conductive straps is not insulated, as it is unlikely that bond wire will short circuit against other bond wires.

Refer to FIG. 1A. An IC device is packaged in a BGA substrate 5. Semiconductor device 100 is attached on an attachment area 10. The semiconductor device 100 has a plurality of bonding pads 20a, 25a, 30a, and 35a. A lead frame with a plurality of bonding fingers 20b, 25b, 30b, and 35b surrounds the die attachment area 10. Each of these respective bonding pads (20a, 25a, 30a, and 35a) and bonding fingers (20b, 25b, 30b, and 35b) will be connected to one another. In the example, bonding finger 25b is a voltage (VDD) connection and bonding finger 30b is a ground (GND) connection, and bonding finger 20b is one signal (SIG) connection. These three example connections are provided additional surrounding insulation according to an embodiment of the present invention. Another signal connection (SIG2) bond finger 35b is connected with a bond wire to bond pad 35a.

A layer of insulating material 15 applied to the substrate 5. A conductive strap region 25c is defined between the VDD bond finger 25b and bond pad 25a. Another conductive strap region 30c is defined between the GND bond finger 30b and bond pad 30a. An opening 20c is defined between SIG bond finger 20b and bond finger 20a. Another opening 35c is defined between bond finger 35b and bond pad 35a. The conductive strap regions may be defined with photolithography. It may be integrated into the solder mask. Molded plastic areas may define trenches containing the conductive straps. In a particular process, parylene may be selectively applied by painting or spraying.

Figure 1B:
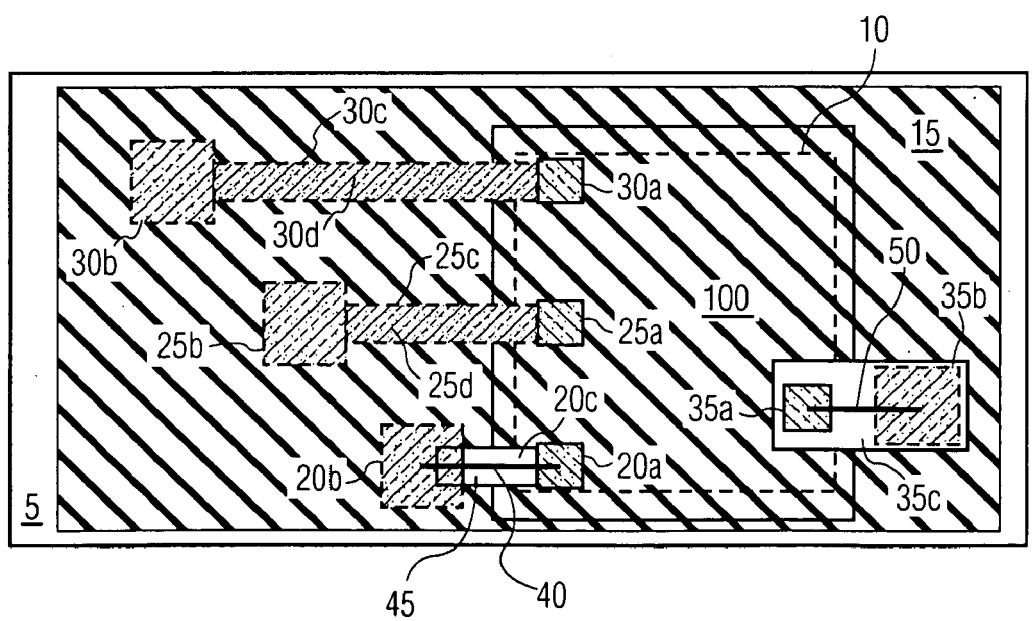
FIG. 1B is the view of FIG. 1B with the insulating trenches filled with conductive material connecting the voltage references from the IC device die to the package substrate.

Refer to FIG. 1B. Upon the bond pad 20a defined as a signal (SIG), a bond wire 40 connects the bond pad 20a to a bonding finger 20b that connects to a signal pin 55. The bond wire 40 is covered with a resilient insulation 45. In lieu of non-insulated wire, automatic bonding apparatus dispenses insulated bond wire. Bond wire may be gold, copper, or aluminum depending on the particular application. The bond wire may be insulated with parylene, epoxy, or a polycarbonate. Upon another the bond pad 30a defined as a ground (GND), a conductive strap 30d has been defined in the conductive strap region 30c and connects the bonding pad 30a to the bonding finger 30b that connects to a package ground pin. Upon the other bond pad 25a defined as power PWR), such as VDD, a conductive strap 25d has been defined in the conductive strap region 25c. The bonding pad 25a is connected to the bonding finger 25b that connects to a package ground pin. Bond pad 35a is connected to bond finger 35b with a non-insulated bond wire 50. In this area, there is little chance of adjacent bond wires flexing and touching one another during encapsulation in a passivating envelope. The conductive material may be sputtered metal, electro-plated metal, a conductive plastic applied as a slurry subjected to a curing process, or plasma-deposited metal, etc. Some conductive materials include, but are not limited to, copper, gold, silver, aluminum, nickel, conductive polymer, etc. Additional conductive materials may also include plastics having conductive fillers of aluminum, copper, silver, nickel, and carbon nanotubes, etc.

Figure 1C:
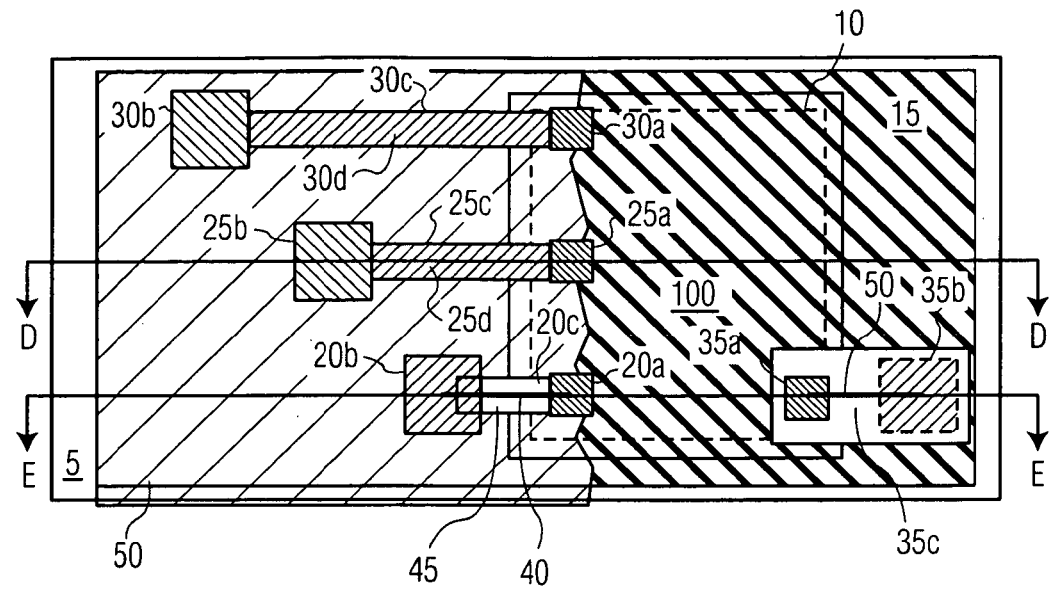
FIG. 1C is the view of FIG. 1B encapsulated in a passivating envelope.

Refer to FIG. 1C. In the package substrate 5, the semiconductor device 100 having been electrically connected to the package, is encapsulated in a passivating envelope 50.

Figure 1D:
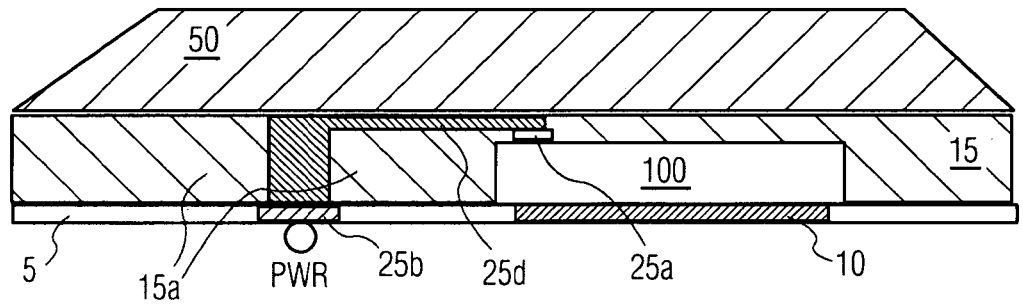
FIG. 1D is a side-view of the package depicted in FIG. 1C, showing the power strap surrounded by insulating material.
Figure 1E:
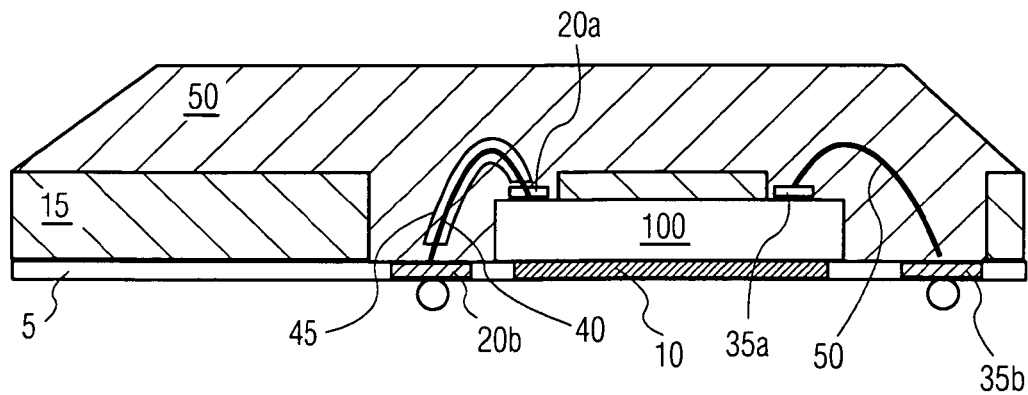
FIG. 1E is a side-view of the package depicted in FIG. 1C, showing an insulated bond wire according to an embodiment of the present invention.

FIGS. 1D and 1E depict in side view to regions of the packaged semiconductor device 100 of FIG. 1C. FIG. 1D shows the conductive strap 25*d* surrounded by the insulating material 15 at 15*a*. FIG. 1E depicts to insulated bond wire 40 and non-insulated bond wire 50. The passivating envelope 50 encapsulates these bond wires 40, 50. The insulating material 15 prevents the conductive straps 25*d* and 30*d* and from shifting owing to forces sustained during encapsulation.

Figure 1F:
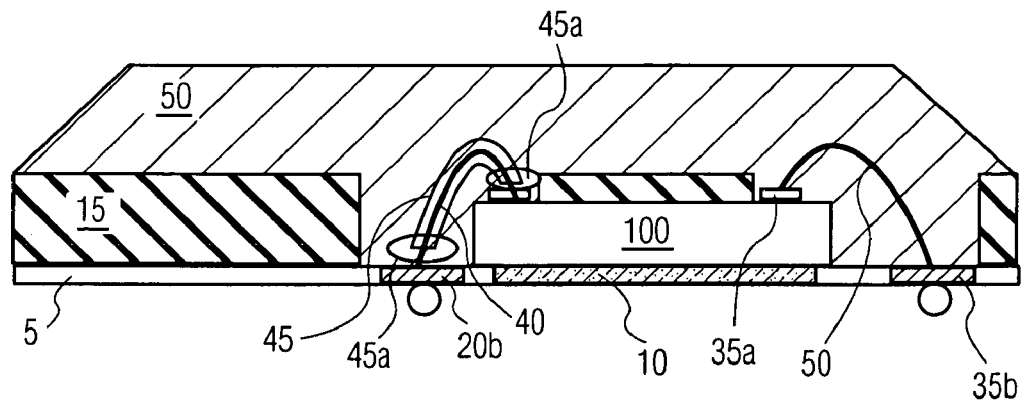
FIG. 1F is a side view of a package showing an embodiment of an insulated bond wire having additional insulation applied at the bond finger and bond pad so that the ends of the insulation are sealed.

In another embodiment according to the present invention, the insulated bond wire 40 has additional insulation applied at the bond finger and bond bad 45*a* so that the ends of the insulation 45 are sealed. Refer to FIG. 1F. The bond wire 40 is fully insulated. A conductive material can envelope the fully insulated bond wire. The conductive material is connected to a reference voltage, such as power and ground. Having the reference voltage closer to the fully insulated bond wire reduces the impedance of the bond wire with respect to that voltage reference.

The embodiments mentioned thus far are applicable to a single layer of insulating material applied to the substrate and the conductive straps are situated on one level. However, the present invention may be applied in a substrate in which multiple levels of conductive straps and insulating layers may be used.

Figure 2:
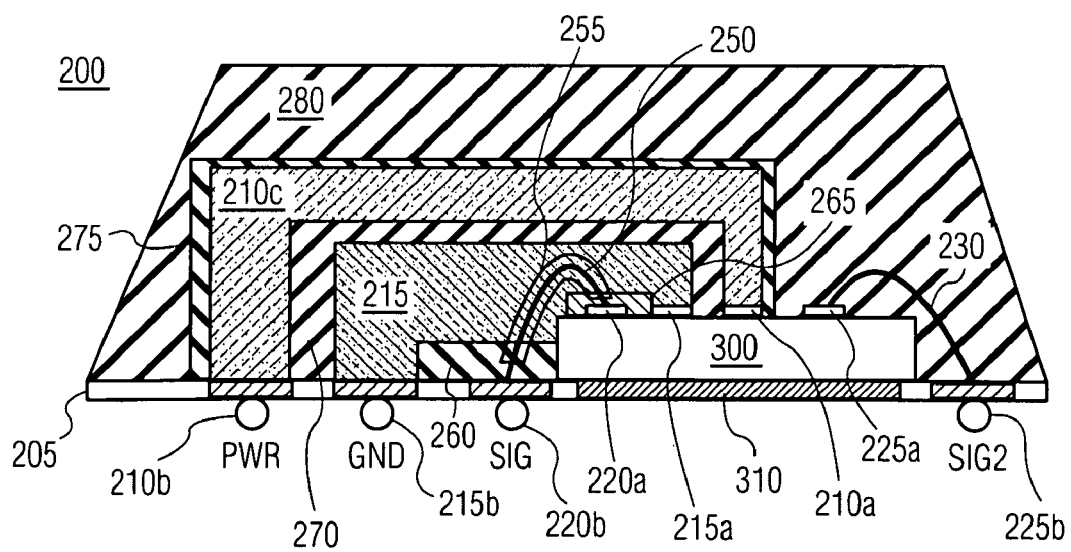
FIG. 2 is a side-view of a package using multiple layers for conductive straps and a conductive strap enveloping an insulated bond wire.

Refer to FIG. 2. A semiconductor device 200 is assembled according to an embodiment of the present invention. A substrate 205 has respective bond fingers 210*b*, 215*b*, 220*b*, and 225*b* for power (PWR), ground (GND), signal (SIG), and a second signal (SIG2). On a semiconductor device die 300 mounted on a die attach region 310, there are bond pads 210*a*, 215*a*, 220*a*, and 225*a* respectively defined as PWR, GND, SIG, and SIG2. These bond pads are electrically connected to corresponding bond fingers 210*b*, 215*b*, 220*b*, and 225*b*, upon which solder balls may be attached. SIG has bond wire 250 connecting its bond finger 220*b* to bond pad 220*a* on semiconductor device 200. Bond wire 250 is surrounded with insulating material 255. At the bond finger 220*b* (SIG), the bond wire 250 with insulating material 255 may be encapsulated in another insulating material 260; at the bond pad 222*a*, the bond wire 250 with insulating material 255 may be encapsulated with another insulating material 265. These additional encapsulation steps serve to protect against short circuits from other conductors formed nearby. A conductive strap 215 connects the pad landing 215*b* (GND) with bond pad 215*a*. Upon the conductive strap 215, insulating material 270 may be applied. A subsequent conductive layer 210*c* connects bond finger 210*b* (PWR). The insulating material 270 prevents the short-circuiting of conductive strap 210*c* with conductive strap 215, Upon conductive strap 210*c*, an additional insulating layer 275 may be applied. In a region in which special precautions against short circuits are not necessary, bond wire 230 connects bond pad 225*a* with bond finger 225*b* at SIG2. After mounting device die 300 and making the electrical connections, as described, the assembly is encapsulated with an insulating material 280.

In another example embodiment, the package as depicted in FIG. 1 may be used, however additional insulated dams are defined between the conductive straps. These dams reduce the probability that the conductive straps move and possibly short-circuit one another during encapsulation.

There may be more that one power supply rail and ground reference on a device. In a complex IC device, several supply sources may be available. For example, a separate power bus and ground bus may be defined for an inner core and a power/ground bus for an outer ring of input/output pins. Often, these separate power/ground buses help improve device performance by isolating input/output switching transients from the IC device core.

Figure 3:
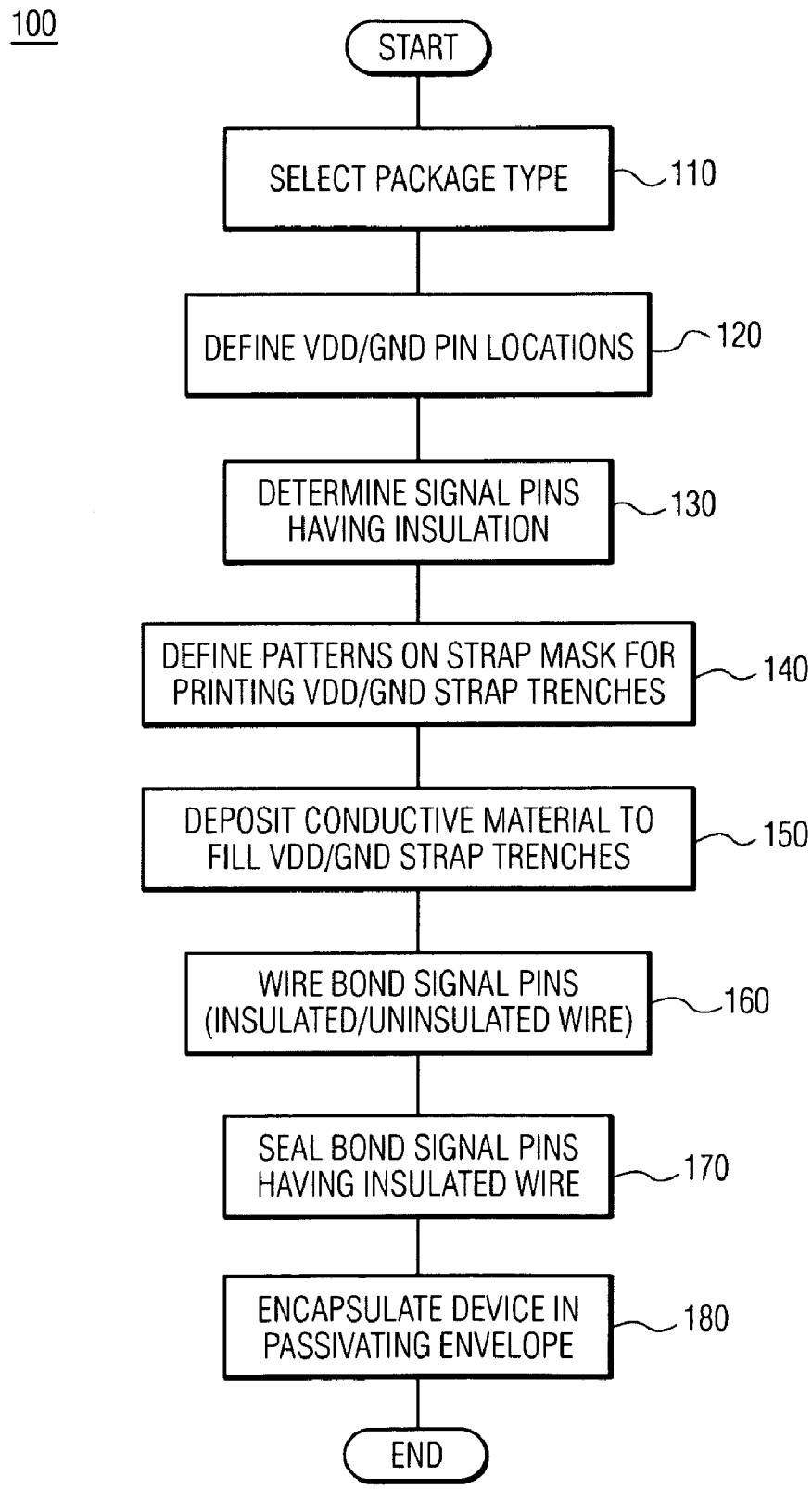
FIG. 3 is a flowchart of a process of electrically enhancing a package according to an embodiment of the present invention.

The present invention may be applied to a variety of packages using wire bonding to connect IC device die. The packages may include, but not limited to leadless chip carriers (LCC), ball grid arrays (BGA), etc. Refer to FIG. 3. In an example process 100 of packaging an IC device according to the present invention, the user first selects a suitable package type 110. The locations 120 of voltage reference pins (i.e., the VDD and GND) are defined at selected bonding fingers that surround the semiconductor die. The locations 130 of the signal pins (i.e., inputs and outputs) are determined. Those signal pins in which impedance has to be controlled may be located closer to voltage reference pins. Also, those pins susceptible to movement during subsequent encapsulation in molding compound necessitate use of insulated bonding wire. Furthermore, insulation at the bond wire ends of these insulated bond wires has to be considered. The location of the voltage references and signal pins is dictated by the particular IC device, package design constraints, manufacturability, cost, etc.

Having determined the location of the signal pins 130 and voltage reference pins, the location of the conductive straps that connect IC bond pads with their respective package bond fingers are defined 140. A strap mask is generated so that insulating trenches and dams may be printed onto the package substrate. These trenches may be formed with resilient insulating materials. These insulating materials may include, but are not limited to, epoxy, thermoplastic, or silicone, etc. In an example process, the strap mask pattern is applied through standard lithography techniques. A trench surrounding an IC bond pad and its corresponding bonding finger is created. The user applies a conductive material to fill the trenches 150. The voltage references have a more robust electrical connection than that afforded by bonding wires, in that higher currents may pass through them. After making the electrical connections for the voltage references, those pins using wire bonds are bonded 160. To protect against bond wires from short-circuiting one another, bond wire covered with a resilient insulating material is used. At the ends of the insulated bond wires (at the bond pad and lead frame bond finger, additional insulation 170 may be added. To seal the IC device die and connections from damage, the package undergoes encapsulation 180 in a suitable molding compound.

While the present invention has been described with reference to several particular example embodiments, those skilled in the art will recognize that many changes may be made thereto without departing from the spirit and scope of the present invention, which is set forth in the following claims.

The invention claimed is:

1. An integrated circuit (IC) device in packaging having electrically insulated connections, comprising:
   a semiconductor device mounted onto an attachment area, the semiconductor device having a plurality of bonding pads;

a lead frame surrounding the die attachment area, the lead frame having a plurality of bonding fingers;

a plurality of mutually isolated connection conductors having respective first ends attached to respective bonding pads on the semiconductor device and having respective second respective second ends attached to respective bonding fingers of the lead frame, wherein the plurality of mutually isolated connection conductors includes a bond wire coated with an insulating coating and a conductive strap surrounded by a dam of insulating material such that the dam of insulating material separates the conductive strap from the bond wire.

2. The IC device as recited in claim 1, further including a passivation envelope encapsulating the semiconductor device, mutually isolated connection conductors, and bonding fingers of the lead frame.

3. The IC device as recited in claim 2, wherein the plurality of mutually isolated connection conductors are of two types: a signal connection and a voltage reference connection.

4. The IC device as recited in claim 2, wherein the signal connection is a bond wire coated with an insulating coating.

5. The IC device as recited in claim 2, wherein the voltage reference connection is a conductive strap surrounded by dams of insulating material.

6. The IC device as recited in claim 5, wherein the conductive strap is at least one of the following: copper, aluminum, gold, silver, nickel, solder, plastic with conductive filler.

7. An integrated circuit (IC) device in a BGA package substrate, the BGA package substrate having electrically insulated connections, comprising:
a semiconductor device mounted onto an attachment area, the semiconductor device having bonding pads, wherein the bonding pads includes a first bonding pad encapsulated by a first insulating material and a second bonding pad unencapsulated by the first insulating material;
bonding fingers surrounding the die attachment area;
a plurality of mutually isolated connection conductors having respective first ends attached to respective bonding pads on the semiconductor device and having respective second ends attached to respective bonding fingers, wherein the plurality of mutually isolated connection conductors includes a first and second isolated connection conductors, wherein the first end of the first isolated connection conductor is attached to the first bonding pad encapsulated by the first insulating material and the first end of the second isolated connection conductor is attached to the bonding pad unencapsulated by the first insulating material, and
a second insulating material coating at least a portion of one of the first and second isolated connection conductors.

8. The IC device as recited in claim 7, wherein the plurality of mutually isolated connection conductors are of two types: a signal connection and a voltage reference connection.

9. The IC device as recited in claim 8, wherein the voltage reference connection is a conductive strap defined in the package substrate, the conductive strap surrounded by insulating material; and wherein the signal connection is a bond wire coated with an insulating material.

10. The IC device of claim 7, further comprising a dam of insulating material positioned between the first and second isolated connection conductors to electrically isolate the first and second isolated connection conductors from each other.

11. The IC device of claim 10, further comprising a passivation envelope over and encapsulating the first and second bonding pads and the first and second isolated connection conductors.

12. The IC device of claim 7, wherein the first isolated connection conductor is a bond wire coated with the second insulating material and wherein the second isolated connection conductor is a conductive strap.

13. The IC device of claim 7, further comprising a dam of insulating material positioned between the conductive strap and the bond wire to electrically isolate the conductive strap from the bond wire.

14. The IC device of claim 7, wherein the second insulating material is different than the first insulating material.

15. An integrated circuit (IC) device in a package substrate, the package substrate having electrically insulated connections, comprising:
a semiconductor device mounted onto an attachment area, the semiconductor device having bonding pads;
bonding fingers surrounding the die attachment area;
signal connection conductors having respective first ends attached to respective bonding pads on the semiconductor device and having respective second ends attached to respective bonding fingers, wherein a number of the signal connection conductors are bond wires coated with a resilient insulating coating;
voltage reference conductors having respective first ends attached to respective bonding pads on the semiconductor device and having respective second ends attached to respective bonding finger, wherein a number of the voltage reference conductors are conductive straps surrounded by dams of insulating material; and
a passivation envelope encapsulating the semiconductor device, signal connection conductors, voltage reference conductors, and bonding fingers on the substrate.

16. The IC device as recited in claim 15, wherein bond wires coated with the resilient insulating coating where attached at their respective first ends and second ends are sealed with additional resilient insulating coating.

17. The IC device as recited in claim 16, wherein the package substrate is a ball grid array (BGA).

18. The IC device as recited in claim 16, wherein the resilient coating of the bond wires is selected from at least one of the following: parylene, epoxy, or a polycarbonate.

19. The IC device as recited in claim 16, wherein the insulating material of the dams is selected from at least one of the following: substrate material, solder mask.

20. The IC device as recited in claim 16, wherein the conductive straps are of conductive material selected from at least one of the following: copper, gold, silver, aluminum, nickel, conductive polymer, plastics having conductive fillers of aluminum, copper, silver, nickel, and carbon nanotubes.

* * * * *